(12) United States Patent
Okamoto et al.

(10) Patent No.: US 8,516,178 B2
(45) Date of Patent: *Aug. 20, 2013

(54) PROGRAMMABLE MEMORY SYSTEM

(75) Inventors: Kosei Okamoto, Kunitachi (JP);
Hiroyuki Sakamoto, Ome (JP); Akihisa Fujimoto, Fussa (JP); Masao Suga, Ome (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/527,140

(22) Filed: Jun. 19, 2012

(65) Prior Publication Data

US 2012/0260001 A1    Oct. 11, 2012

Related U.S. Application Data

(63) Continuation of application No. 13/191,958, filed on Jul. 27, 2011, now Pat. No. 8,219,733, which is a continuation of application No. 12/836,195, filed on Jul. 14, 2010, now Pat. No. 8,015,338, which is a continuation of application No. 11/798,582, filed on May 15, 2007, now Pat. No. 7,779,192, which is a continuation of application No. 11/600,776, filed on Nov. 17, 2006, now Pat. No. 7,237,052, which is a continuation of application No. 11/366,379, filed on Mar. 3, 2006, now Pat. No. 7,162,561, which is a continuation of application No. 11/001,309, filed on Dec. 2, 2004, now Pat. No. 7,051,142, which is a continuation of application No. 09/799,600, filed on Mar. 7, 2001, now Pat. No. 6,842,818.

(30) Foreign Application Priority Data

Mar. 8, 2000    (JP) .................................. 2000-063884

(51) Int. Cl.
*H05K 7/10*    (2006.01)
*G06F 3/00*    (2006.01)
*G06F 13/36*    (2006.01)
*G06F 13/42*    (2006.01)

(52) U.S. Cl.
USPC ................. 710/301; 710/11; 710/14; 710/16; 710/74; 710/105

(58) Field of Classification Search
USPC ............ 710/11, 14, 16, 62–63, 105, 301–302
See application file for complete search history.

(56) References Cited

U.S. PATENT DOCUMENTS

| 5,237,674 A | 8/1993 | Mohme et al. |
| 5,428,560 A | 6/1995 | Leon et al. |

(Continued)

FOREIGN PATENT DOCUMENTS

| EP | 0 981 805 A | 3/2000 |
| JP | 2-190955 | 7/1990 |

(Continued)

OTHER PUBLICATIONS

PC Card Standard, Release 7, Electrical Specification vol. 2, Feb. 1999.

(Continued)

*Primary Examiner* — Thomas J Cleary
(74) *Attorney, Agent, or Firm* — Finnegan, Henderson, Farabow, Garrett & Dunner, LLP

(57) ABSTRACT

In one embodiment, a system having a non-volatile programmable memory and a controller is provided. The system has data pins that are configured to be accessed in one of a first mode and a second mode such that, in the first mode, the system receives information using one of the data pins and, in the second mode, the system receives information using four of the data pins. The system also has a command pin that is configured to receive a first command, a second command, and a third command, the first command requesting a current operation mode of the data pins, the second command requesting operation voltage information of the system, and the third command setting the system into one of the first and second modes. Additionally, the system has a power signal pin configured to receive power for the system.

9 Claims, 7 Drawing Sheets

(56) References Cited

U.S. PATENT DOCUMENTS

| | | | |
|---|---|---|---|
| 5,440,244 | A | 8/1995 | Richter et al. |
| 5,615,344 | A | 3/1997 | Corder |
| 5,671,368 | A | 9/1997 | Chan et al. |
| 5,696,970 | A | 12/1997 | Sandage et al. |
| 5,752,048 | A | 5/1998 | Antol et al. |
| 5,768,542 | A | 6/1998 | Enstrom et al. |
| 5,778,195 | A | 7/1998 | Gochi |
| 5,784,595 | A | 7/1998 | Devins et al. |
| 5,877,975 | A | 3/1999 | Jigour et al. |
| 5,909,596 | A | 6/1999 | Mizuta |
| 5,938,750 | A | 8/1999 | Shaberman |
| 5,966,723 | A | 10/1999 | James et al. |
| 6,035,357 | A | 3/2000 | Sakaki |
| 6,088,746 | A | 7/2000 | Köppä |
| 6,138,180 | A | 10/2000 | Zegelin |
| 6,145,046 | A | 11/2000 | Jones |
| 6,149,319 | A | 11/2000 | Richter et al. |
| 6,168,077 | B1 | 1/2001 | Gray et al. |
| 6,182,173 | B1 | 1/2001 | Grosser et al. |
| 6,182,204 | B1 | 1/2001 | Nakashima |
| 6,184,592 | B1 | 2/2001 | Rauhala et al. |
| 6,279,114 | B1 | 8/2001 | Toombs et al. |
| 6,281,798 | B1 | 8/2001 | Laurent et al. |
| 6,340,117 | B1 | 1/2002 | Eisele et al. |
| 6,354,489 | B2 | 3/2002 | Tanaka |
| 6,385,667 | B1 | 5/2002 | Estakhri et al. |
| 6,393,492 | B1 | 5/2002 | Cornaby et al. |
| 6,434,654 | B1 | 8/2002 | Story et al. |
| 6,481,629 | B1 | 11/2002 | Hirabayashi et al. |
| 6,581,157 | B1 | 6/2003 | Chiles et al. |
| 6,801,328 | B2 | 10/2004 | Tsukamoto et al. |
| 6,842,818 | B2 | 1/2005 | Okamoto et al. |
| 6,901,457 | B1 | 5/2005 | Toombs et al. |
| 7,051,142 | B2 | 5/2006 | Okamoto et al. |
| 7,162,561 | B2 | 1/2007 | Okamoto et al. |
| 7,237,052 | B2 | 6/2007 | Okamoto et al. |
| 7,350,009 | B2 | 3/2008 | Okamoto et al. |
| 7,774,533 | B2 | 8/2010 | Okamoto et al. |
| 7,779,192 | B2 | 8/2010 | Okamoto et al. |
| 8,219,733 | B2 * | 7/2012 | Okamoto et al. ............ 710/301 |

FOREIGN PATENT DOCUMENTS

| | | |
|---|---|---|
| JP | 03252848 A | 11/1991 |
| JP | 05040728 A | 2/1993 |
| JP | 8-211973 | 8/1996 |
| JP | 10-49257 | 2/1998 |
| JP | 10171938 A | 6/1998 |
| JP | 11275000 A | 10/1999 |
| WO | WO 99-21127 | 4/1999 |
| WO | WO 99/49415 A | 9/1999 |

OTHER PUBLICATIONS

Decision of Rejection mailed by the Japanese Patent Office on May 7, 2008, for Japanese Patent Application No. 2000-063884, and English-language translation thereof.

Notification of Reasons for Rejection issued by the Japanese Patent Office on May 8, 2007, for Japanese Patent Applicatin No. 2000-063884, and English-language translation thereof.

Office Action for U.S. Appl. No. 09/799,600 dated Nov. 20, 2003 (19 pages).

Office Action for U.S. Appl. No. 09/799,600 dated Dec. 1, 2003 (4 pages).

Final Office Action for U.S. Appl. No. 09/799,600 dated Apr. 22, 2004 (17 pages).

Advisory Action for U.S. Appl. No. 09/799,600 dated Aug. 13, 2004 (2 pages).

Office Action for U.S. Appl. No. 11/001,309 dated May 17, 2005 (19 pages).

Notice of Allowance for U.S. Appl. No. 11/001,309 dated Nov. 8, 2005 (7 pages).

Office Action U.S. Appl. No. 11/001,309 dated Apr. 6, 2006 (3 pages).

Office Action for U.S. Appl. No. 11/366,379 dated Apr. 19, 2006 (10 pages).

Notice of Allowance for U.S. Appl. No. 11/366,379 dated Sep. 8, 2006 (7 pages).

Final Office Action for U.S. Appl. No. 11/600,782 dated Mar. 13, 2007 (8 pages).

Decision Granting Petition to Reset Period for Reply for U.S. Appl. No. 11/600,782 dated Sep. 14, 2007 (9 pages).

Notice of Allowance for U.S. Appl. No. 11/600,782 dated Nov. 6, 2007 (8 pages).

Notice of Allowance for U.S. Appl. No. 11/600,776 dated Mar. 8, 2007 (11 pages).

Supplemental Notice of Allowance for U.S. Appl. No. 11/600,776 dated Apr. 20, 2007 (5 pages).

Office Action for U.S. Appl. No. 12/076,351 dated Nov. 20, 2008 (19 pages).

Final Office Action for U.S. Appl. No. 11/798,582 dated Jul. 16, 2007 (9 pages).

Office Action for U.S. Appl. No. 11/798,582 dated Nov. 15, 2007 (16 pages).

Final Office Action for U.S. Appl. No. 11/798,582 dated Jul. 9, 2008 (19 pages).

Office Action for U.S. Appl. No. 11/798,582 dated Dec. 11, 2008 (25 pages).

* cited by examiner

| OPERATION MODE | NAME | DESCRIPTION | COMMENT |
|---|---|---|---|
| 4 BITS DATA TRANSFER MODE | DAT[0]<br>DAT[1]<br>DAT[2]<br>DAT[3] | DATA LINE<br>DATA LINE<br>DATA LINE<br>DATA LINE | BIDIRECTIONAL<br>BIDIRECTIONAL<br>BIDIRECTIONAL<br>BIDIRECTIONAL |
| 1 BIT I/O TRANSFER MODE | DAT[0]<br>DAT[1]<br>DAT[2]<br>DAT[3] | DATA LINE<br>GENERAL PURPOSE SIGNAL LINE<br>WAIT/READY<br>INT/WAKE | BIDIRECTIONAL<br>CARD → HOST<br>CARD → HOST, SYNCHRONOUS<br>CARD → HOST, ASYNCHRONOUS |
| 2 BITS I/O TRANSFER MODE | DAT[0]<br>DAT[1]<br>DAT[2]<br>DAT[3] | DATA LINE<br>DATA LINE<br>WAIT/READY<br>INT/WAKE | BIDIRECTIONAL<br>BIDIRECTIONAL<br>CARD → HOST, SYNCHRONOUS<br>CARD → HOST, ASYNCHRONOUS |
| USB I/O MODE | DAT[0]<br>DAT[1] | USB DATA LINE<br>USB DATA LINE | |
| 1394 I/O MODE | DAT[0]<br>DAT[1]<br>DAT[2]<br>DAT[3] | 1394 DATA LINE<br>1394 DATA LINE<br>1394 DATA LINE<br>1394 DATA LINE | TPA } TWISTED PAIR<br>TPA*<br>TPB } TWISTED PAIR<br>TPB* |

FIG. 6

PROGRAMMABLE MEMORY SYSTEM

CROSS-REFERENCE TO RELATED APPLICATIONS

This application is a continuation of application Ser. No. 13/191,958, filed Jul. 27, 2011 now U.S. pat. No. 8,219,733, which is a continuation of application Ser. No. 12/836,195, filed Jul. 14, 2010 (now U.S. Pat. No. 8,015,338), which is a continuation of application Ser. No. 11/798,582, filed May 15, 2007 (now U.S. Pat. No. 7,779,192), which is a continuation of application Ser. No. 11/600,776, filed Nov. 17, 2006 (now U.S. Pat. No. 7,237,052), which is a continuation of application Ser. No. 11/366,379, filed Mar. 3, 2006 (now U.S. Pat. No. 7,162,561), which is a continuation of application Ser. No. 11/001,309, filed Dec. 2, 2004 (now U.S. Pat. No. 7,051,142), which is a continuation of application Ser. No. 09/799,600, filed Mar. 7, 2001 (now U.S. Pat. No. 6,842,818), and claims the benefit of Japanese Application No. 2000-063884, filed Mar. 8, 2000, and all of the applications are incorporated herein by reference.

BACKGROUND OF THE INVENTION

The present invention relates to an electronic device equipped with a card interface, and more particularly to an electronic device suitable to set an operation mode for a card-shaped device connected thereto via the card interface.

Various types of electronic devices represented by personal computers generally have a function of using an IC card (PC card) based on the PCMCIA (Personal Computer Memory Card. International Association). The PC card is used not only as a data storing medium but also for expanding its peripheral function. For example, there are some PC cards that function as a modem card, a network card, a hard disk drive, and a transmitter, etc.

Further, in recent years, IC cards smaller than the PC cards are being used as well as the PC cards. One of these small IC cards is a small memory card that has a flash memory for storing various types of digital data represented by image data or music data. As is well known, the flash memory is a non-volatile memory, which is electrically programmable and has its stored contents kept as they are even when power supply is interrupted. In such small memory cards having a flash memory, in general, only one of a plurality of pins is used as a data pin (data line). Accordingly, the small memory cards execute 1-bit data transfer.

Furthermore, a small memory card called an "SD (Secure Digital) memory card" is also available. The SD memory card has been developed by Matsushita Electric Industrial Co., Ltd., SanDisk Corporation and Toshiba Corporation. The SD memory card has nine signal pins, four of which can be used as data lines. Thus, the SD memory card realizes 4-bit data transfer, which means that it has a higher data transfer capacity than the previous small memory card that executes 1-bit data transfer.

As another small card, there is an I/O card having an I/O (Input/Output) interface function. After the appearance of the SD memory card, it is requested that such a small I/O card and the SD memory card can be used through a common card slot formed in an electronic device (a host) such as a personal computer, as in the case of the PC cards. To enable a small memory card, such as the SD memory card, and various types of small I/O cards to be commonly used in an electronic device, it is necessary to give those cards, for example, the same pin arrangement and the same shape. Even in this case, however, the following problem will occur.

In small memory cards, many of the pins provided therein are used as data lines to enhance their data transfer capacity. For example, in the SD memory card, four of the nine pins are used as data lines as aforementioned. Accordingly, if the same pin arrangement and the same shape are imparted to the small memory cards and the small I/O cards, many pins are used for data transfer between an electronic device and each small I/O card. Using a lot of pins as data lines to enhance the data transfer capacity is effective in the case of a card-shaped device such as a memory card, which does not execute data transfer so often but transfers a large amount of data at one time. On the other hand, it is not so important to enhance the data transfer capacity in the case of a card-shaped device such as an I/O card, which executes data transfer (i.e. transaction) many times although it does not transfer a large amount of data at one time. It is more important to start data transfer quickly, i.e. to increase the speed of a response.

BRIEF SUMMARY OF THE INVENTION

The present invention has been developed in light of the above, and aims to enable an electronic device to set an operation mode for a card-shaped device which is connected thereto when it is used, by a common procedure irrespective of the type of the card-shaped device, the operation mode including signal assignment and being peculiar to the card-shaped device.

To attain the aim, an electronic device according to a first aspect comprises a card interface, operation mode acquiring means and operation mode setting means. The card interface is designed to be connected to a card-shaped device that has a connector section provided with connector pins including data pins. The operation mode acquiring means acquires, when the card interface is connected to the card-shaped device, operation mode information of the card-shaped device via a predetermined one of the connector pins of the card-shaped device other than the data pins. The operation mode setting means executes signal assignment on each of the data pins on the basis of the operation mode information acquired by the operation mode acquiring means.

In this electronic device, even when a memory card and various types of I/O cards having different interface functions are made to have a common pin arrangement, an operation mode including a mode for signal assignment on the data pins of each card (card-shaped device) connected to the electronic device can be set at an operation mode peculiar to the card. Moreover, this operation mode setting can be executed irrespective of, for example, the type of each card.

An electronic device according to a second aspect further comprises operation condition acquiring means and power supply voltage switch means. The operation condition acquiring means acquires, via the predetermined connector pin, an operation condition of the card-shaped device, the operation condition including an operating voltage applied to the card-shaped device. The switch means switches a power supply voltage, supplied to the card-shaped device, from a predetermined initial voltage to the operating voltage included in the operation condition.

In this electronic device, an operation condition suitable for a card-shaped device connected to the electronic device can be set irrespective of, for example, the type of the card-shaped device.

In an electronic device according to a third aspect, the operation mode setting means has three functions. A first function is a function of assigning all the data pins to a data transfer process when the operation mode information indicates a first operation mode. A second function is a function executed when the operation mode information indicates the second operation mode, i.e. a function of assigning a predetermined number of ones of the data pins to the data transfer process, assigning one of the remaining data pins to a process of transmitting a general purpose signal, assigning another of the remaining data pins to a process of informing the electronic device of a state of the card-shaped device, and assigning yet another of the remaining data pins to a process of transmitting an asynchronous interrupt signal from the card-shaped device to the electronic device. A third function is a function executed when the operation mode information indicates the third operation mode, i.e. a function of assigning another predetermined number, larger than the first-mentioned predetermined number, of ones of the data pins to the data transfer process, assigning one of the remaining data pins to the process of informing the electronic device of the state of the card-shaped device, and assigning another of the remaining data pins to the process of transmitting an asynchronous interrupt signal from the card-shaped device to the electronic device.

In this electronic device, signal assignment suitable for each card-shaped device is executed thereon. For example, in a card-shaped device having operation mode information that indicates the first operation mode, all data pins are assigned to a data transfer process. Thus, the first operation mode is suitable for a card-shaped device that is required to transfer a large amount of data at high speed, although it does not execute data transfer so many times. In a card-shaped device having operation mode information that indicates the second operation mode, a smaller number of data pins are assigned to the data transfer process, but the remaining data pins are assigned to a process of transmitting a general purpose signal, a process of informing the electronic device of a state of the card-shaped device, and a process of transmitting an asynchronous interrupt signal. Accordingly, the second operation mode is suitable for a card-shaped device that is more required to transmit a response at high speed than to have a high data transfer capacity. The second operation mode is most suitable for a card-shaped device such as a modem interface, which needs an audio line, since a general purpose signal line can be used as the audio line. In a card-shaped device having operation mode information that indicates the third operation mode, no pin is assigned to be used as a general purpose signal line, but the number of data lines increases by one, as compared with the device having the operation mode information that indicates the second operation mode. Accordingly, the third operation mode is suitable for a card-shaped device such as a LAN interface, which is required to have a high data transfer capacity and high-speed response capability.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain, the principles of the invention.

FIG. 6 is a view illustrating an example of a relationship between each operation mode employed in an I/O interface mode, and signal assignment;

DETAILED DESCRIPTION OF THE INVENTION

The embodiment of the invention will be described with reference to the accompanying drawings.

Figure 1:
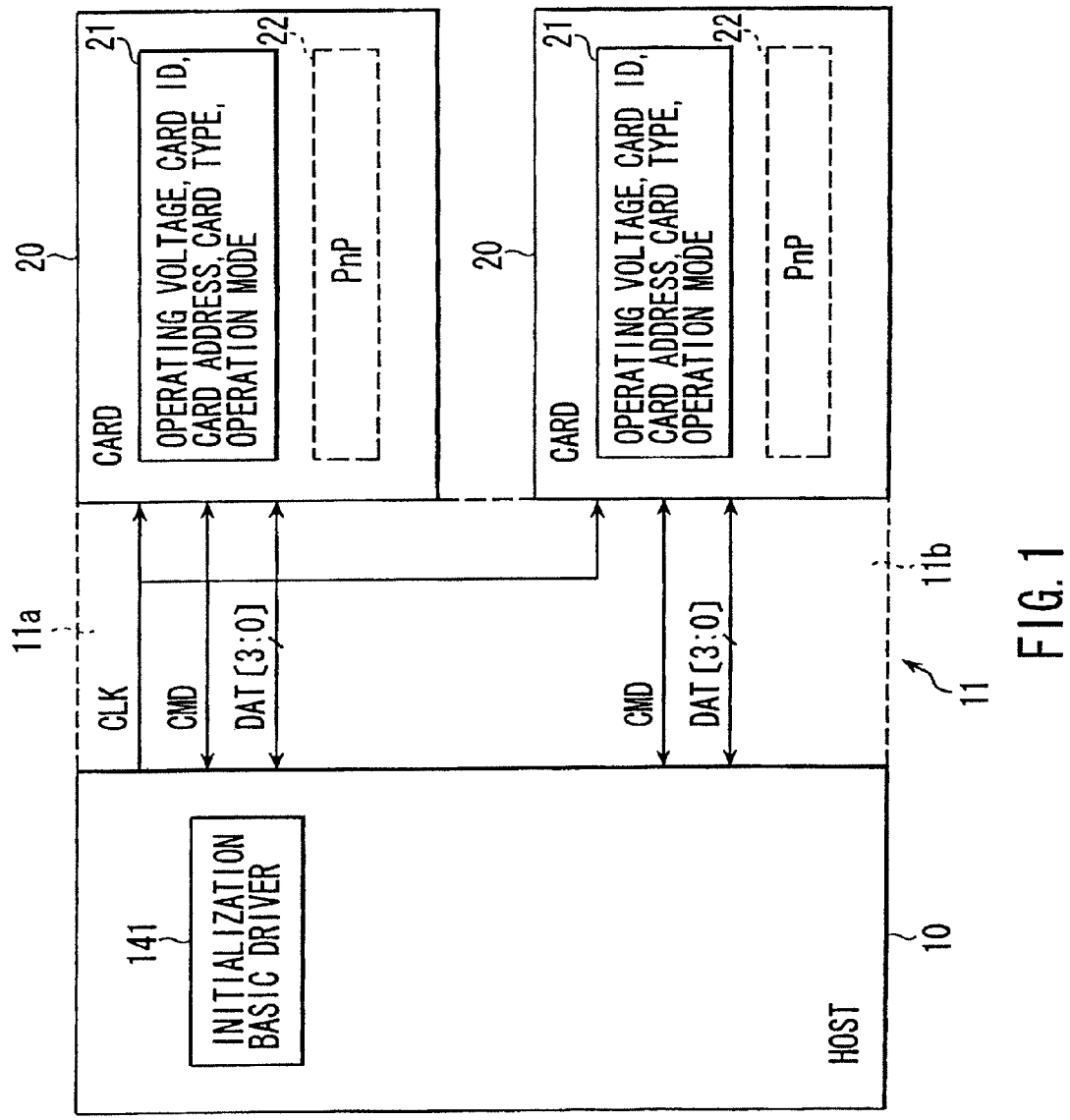
FIG. 1 is a block, diagram illustrating the structure of an information processing system according to the embodiment of the invention.

FIG. 1 is a block diagram illustrating the structure of an information processing system according to the embodiment of the invention.

In FIG. 1, a host system (hereinafter referred to as a "host") 10 consists of an electronic device such as a portable personal computer. The host 10 has a card interface 11. The card interface 11 has, for example, two card slots 11a and 11b that enable two small card-shaped devices (hereinafter referred to simply as "cards") 20 to be inserted therein. For the convenience of drawing, FIG. 1 shows a card slot structure in which two cards 20 arranged in a single plane are inserted. Actually, however, the card slot has a structure that enables two cards 20 to be inserted in two vertical stages.

The card interface 11 assigns, to each card 20, a clock (CLK) line, a command (CMD) line, and four signal lines (DAT[3:0] line) that can be assigned to be used, for example, as data lines. DAT[3:0] indicates four signal lines DAT[3]-DAT[0]. FIG. 1 does not show a power supply (VDD) line or a ground (GND) line. The CLK line can be commonly used for different cards 20. Therefore, in the embodiment, CLK lines for respective cards 20 are connected on the card interface 11, thereby enabling the CLK lines to be commonly driven by the host 10. The same can be said of the VDD and GND lines.

The host 10 includes an initialization basic driver 141 for executing a process for initializing each card 20. On the other hand, each card 20 has a card register file 21. The card register file 21 includes a group of registers that pre-store respective data items such as an operating voltage, a card ID, card address, a card type and an operation mode, etc. for each card 20. The card ID is identification data peculiar to each card 20. The card address is an address pre-assigned to each card 20. The card type indicates whether each card 20 is a memory card or an I/O card. The operation mode will be described later. If each card 20 is an I/O card, it also includes a system I/O register 22. The system I/O register 22 pre-stores plug-and-play information (hereinafter referred to as "PnP information") necessary for realizing a plug-and-play function. The PnP information includes data indicating the type of the I/O card, data as to whether or not a device driver peculiar to the I/O card is incorporated therein, and data indicating the version of the driver, if there is one. A Bluetooth interface, a USB (Universal Serial Bus) interface, a LAN (Local Area Network) interface, a GPS (Global Positioning System) interface and a portable telephone interface, etc. are considered as I/O cards.

Figure 2:
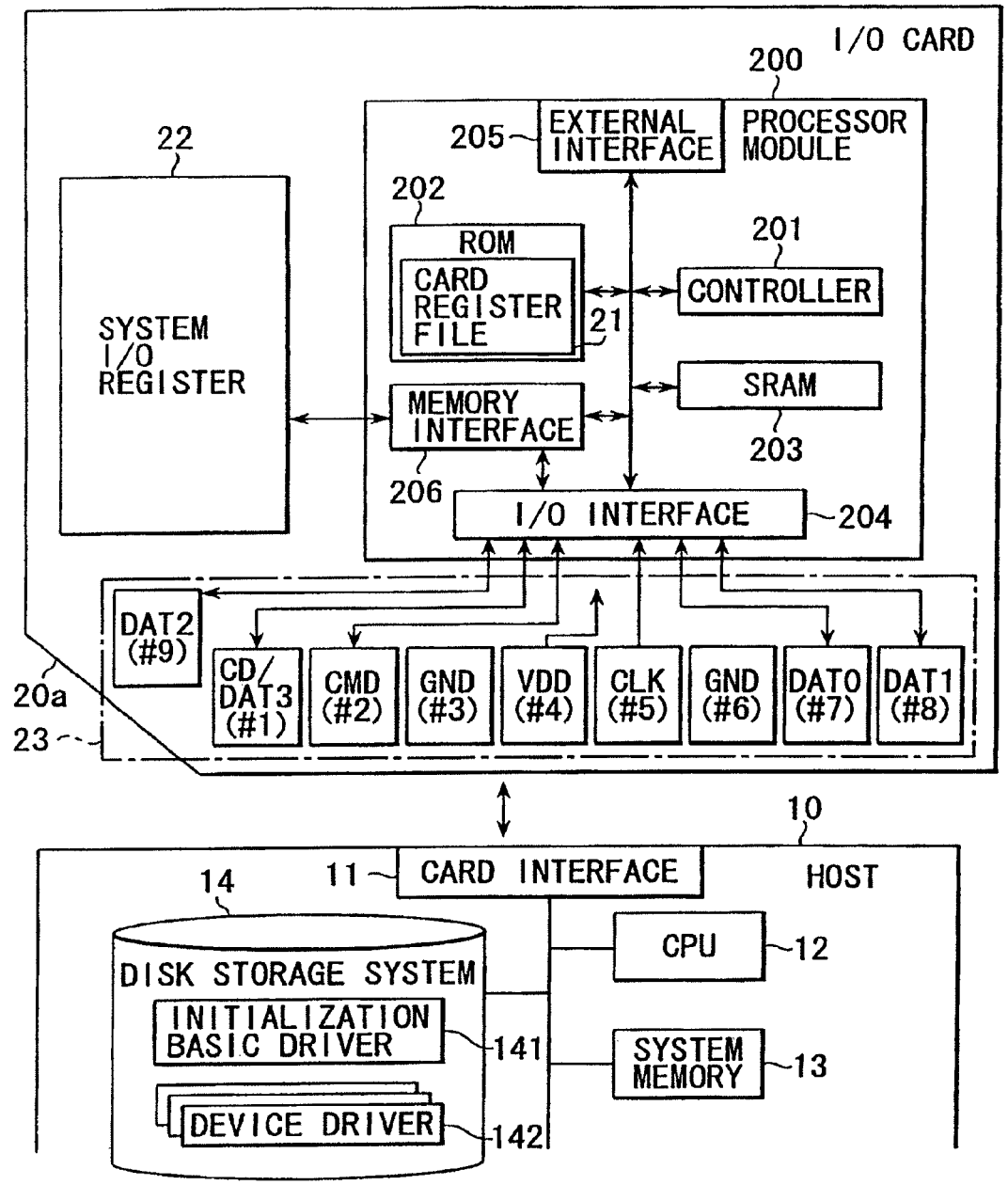
FIG. 2 is a view illustrating a rough structure of a host 10, and the structure of an I/O card 20a as a card 20.

FIG. 2 shows a rough structure of the host 10, and the structure of an I/O card 20a as the card 20. The host 10 has, as well as the card interface 11, a CPU (Central Processing Unit) 12, a system memory 13 and a disk storage system 14. The CPU 12 controls the entire host 10. The system memory 13 is used to store various types of data, and programs to be executed by the CPU 12. The system memory 13 is formed of, for example, a RAM (Random Access Memory). The disk storage system 14 is formed of, for example, a hard disk drive. The disk storage system 14 incorporates various types of device drivers 142, as well as the initialization basic driver 141. The device drivers 142 include device drivers prepared for and peculiar to the respective types of I/O cards.

The I/O card 20a has a connector section 23 in which nine signal pins with the numbers 1-9 are arranged. In this embodiment, the signal terminals provided in the connector section 23 are called "signal pins". However, this name does not necessarily indicate the shape of the signal terminals. In the case of FIG. 2, the signal pins provided in the connector section 23 are printed pads. A pin, numbered 1, is called "DAT 3 (DAT[3])", and can be assigned to be used, for example, as a data terminal. A pin, numbered 2, is called "CMD", and is assigned to be used as a terminal for transferring a command from the host 10 to the I/O card 20a, and a response to the command from the I/O card 20a to the host 10. A pin, numbered 3, is called "GND (Vss1)" and assigned to be used as a first ground signal terminal. A pin, numbered 4, is called "VDD" and assigned to be used as a power signal terminal. A pin, numbered 5, is called "CLIC" and assigned to be used as a clock terminal. A pin, numbered 6, is called "GND (Vss2)" and assigned to be used as a second ground signal terminal. A pin, numbered 7, is called "DAT 0 (DAT[0])", and is assigned to be used as a data terminal. Pins, numbered 8 and 9, are called "DAT 1 (DAT[1])" and "DAT 2 (DAT[2])", respectively, and are assigned to be used as data terminals. The above-mentioned pin arrangement and signal assignment to each pin in the I/O card 20a are commonly employed in different types of I/O cards 20a. Further, the same can be said of memory cards. In other words, the same pin arrangement and the same signal assignment are employed in all types of cards 20. However, signals assigned to DAT[3]-DAT[0] (DAT [3:0]) differ between different types of cards 20. Further, in the case of the I/O card 20a, signals assigned to those pins differ between different types of I/O cards 20a. For example, in the case of a memory card, DAT[3]-DAT[0] are assigned to be used as respective bidirectional data lines (data terminals). DAT[3] is also assigned to be used as a card detection terminal. Signal assignment concerning DAT[3]-DAT[0] in the case of the I/O card 20a will be described later.

The I/O card 20a has a processor module 200. The processor module 200 includes a controller 201, a ROM 202, a SRAM (Static RAM) 203, an I/O interface 204, an external interface 205 and a memory interface 206. The controller 201 is a microprocessor for controlling the entire I/O card 20a. The ROM 202 stores control programs to be executed by the controller 201. A predetermined area of the ROM 22 is assigned to be used as the card register file 21 shown in FIG. 1. The SRAM 203 is used as a work/buffer memory incorporated in the processor module 200. The I/O interface 204 is connected to the nine signal pins of the I/O card 20a and serves as an interface between the I/O card 20a and the host 10. The external interface 205 serves as an Interface between the I/O card 20a and an external I/O device 60. The memory interface 206 serves as an interface for a flash memory (not shown).

This flash memory is incorporated in the I/O card 20a and formed of a non-volatile programmable memory. A predetermined area of the flash memory is assigned to be used as the aforementioned system I/O register 22. However, the system I/O register 22 may be incorporated in the processor module 200. This structure is applied to an I/O card 20a that does not always need the flash memory.

Figure 3A:
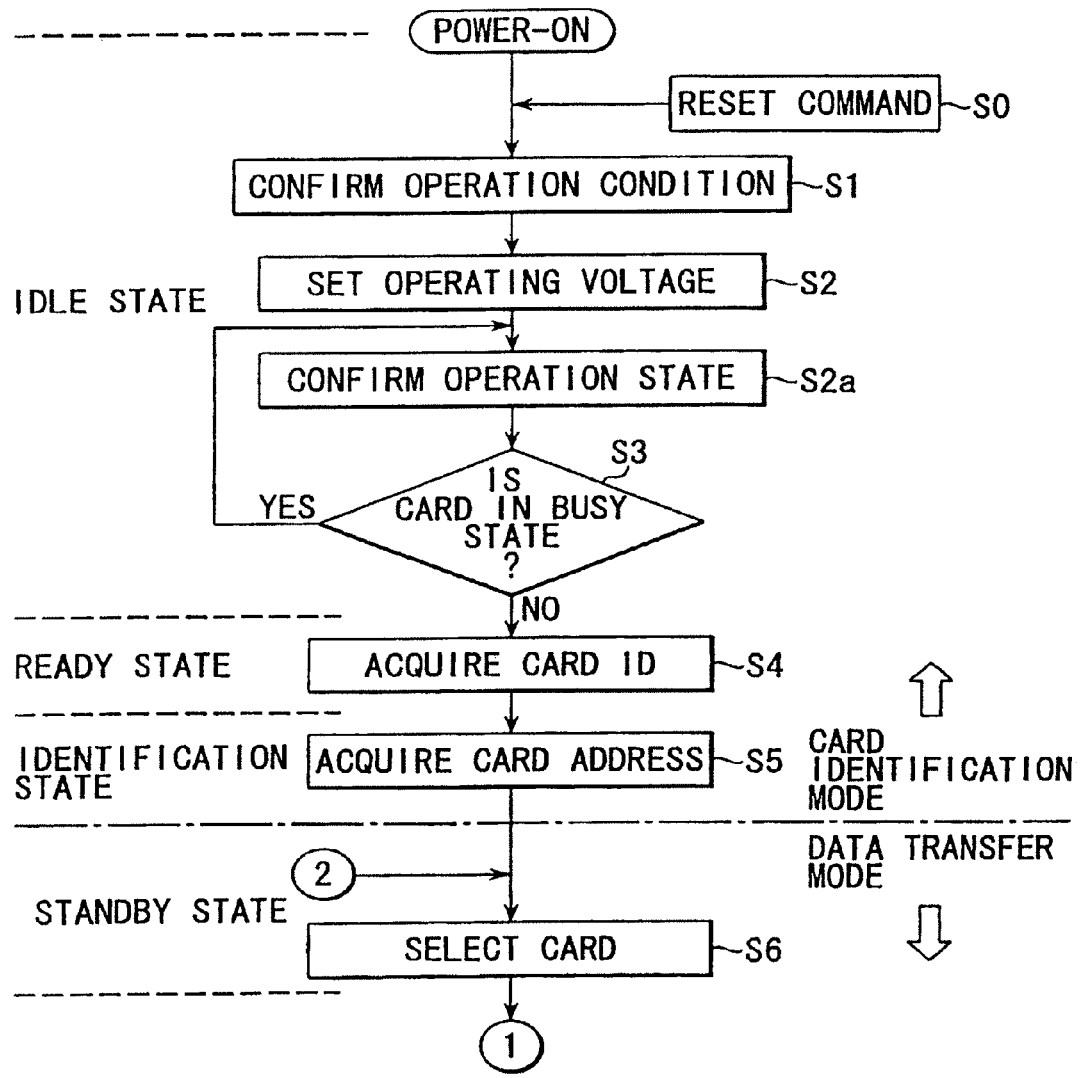
FIGS. 3A and 3B are a flowchart useful in explaining the operation of the host 10, focusing on its card initialization process.
Figure 3B:
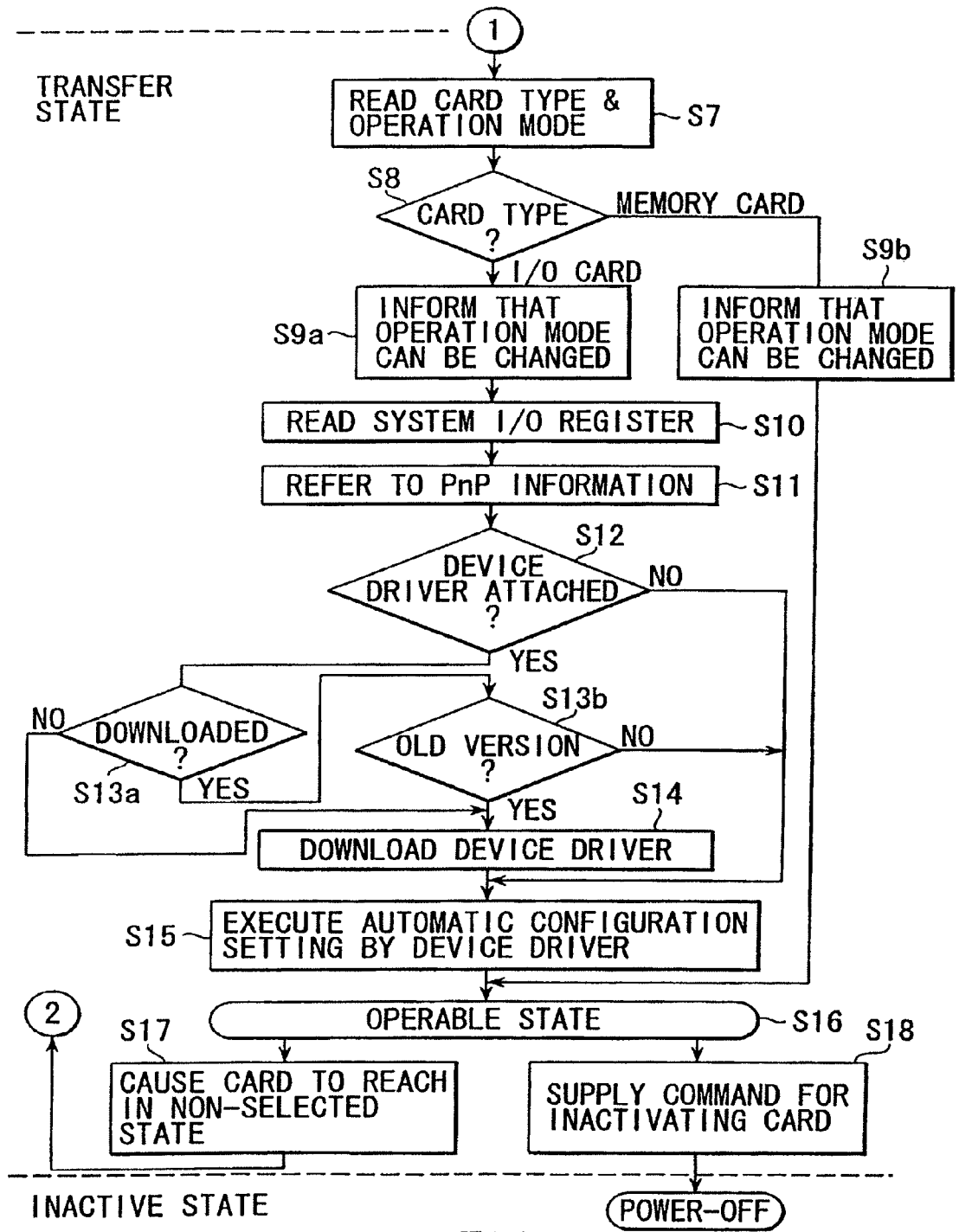

Referring now to the flowchart of FIGS. 3A and 3B, a description will be given of an operation of the embodiment, focusing on its card initialization process. Suppose that a card 20 is inserted in one of the card slots 11a and 11b of the card interface 11, when the host is in an ON (power-on) state. In this state, a power signal and a ground signal are supplied from the host 10 to the card 20 via the VDD line and the GND line, respectively. As a result, the card 20 reaches a power-on state. Further, a clock signal is also supplied from the host 10 to the card 20 via the CLK line. The same state is also reached when the host 10 is turned on after the card 20 is inserted into one of the card slots of the card interface 11. After the card 20 is turned on, the initialization basic driver 141 incorporated in the host 10 starts the card initialization process. For facilitating the description, it may be described that the card initialization process is executed by the host 10. The card initialization process is also started when a reset command is output from the host 10 to the card 20 via a CMD line corresponding to the card 20 and incorporated in the card interface 11 (step S0). It is a matter of course that the initialization basic driver 141 operates after it is loaded from the disk storage system 14 to the system memory 13.

When starting the card initialization process, a power supply voltage supplied from the host to the card 20 via the VDD line is set at a value predetermined irrespective of the type of the card. This voltage will be called an "Initial voltage". In this state, in synchronism with a clock signal supplied via the CLK line, the card 20 executes receipt of a command and transmission of a response in reply to the command, using only the CMD line. This operation is performed irrespective of the card type.

The mode for executing the card initialization process is roughly divided into two modes—a Card Identification Mode and a Data Transfer Mode. In the Card Identification Mode, the card 20 has one of three states—an Idle State, a Ready State and an Identification State. On the other hand, in the Data Transfer Mode, the card 20 has one of three states—a Standby State, a Transfer State and an Inactive State.

When the host 10 starts the card initialization process, the operation condition of a card 20 to be subjected to the card initialization process is confirmed (step S1). The step S1 will be described in more detail.

The host 10 supplies, from the card interface 11 to the card 20 to be subjected to the card initialization process, a first command for confirming the operation condition of the card 20. More specifically, the host 10 serially supplies the first command to the card 20 via the CMD line between the host 10 and the card 20 in synchronism with a clock signal on the CLK line.

Upon receiving the first command, the card 20 selects, from its card register file 21, an operation condition including its operating voltage. The card 20 then serially supplies the host 10 with a response, in which the operation condition is set, in reply to the first command via the CMD line in synchronism with the clock signal.

Figure 4:
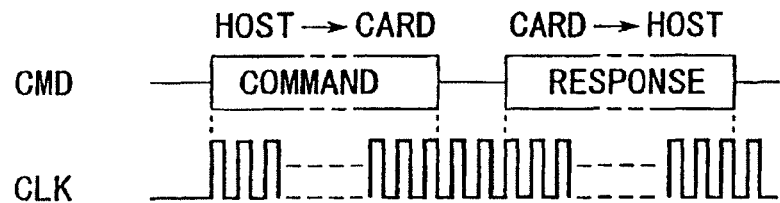
FIG. 4 is a view showing the relationship between a command output from the host 10 to the card 20, a response output from the card 20 to the host 10, and a CLK signal.

FIG. 4 shows the relationship between the command output from the host 10 to the card 20, the response output in reply to the command from the card 20 to the host 10, and the clock signal on the CLK line.

The host 10 receives the response output from the card 20 in reply to the first command. The response contains the operation condition of the card 20 including the operating voltage. The host 10 confirms the operating voltage included in the operation condition of the card 20. These operations are the details of the step S1.

After executing the step S1, the host 10 resets the power supply voltage on the VDD line from the initial voltage to the operating voltage of the card 20 (step S2). Thus, the power supply voltage on the VDD line is switched to an operating voltage suitable for the card 20 connected to the card interface 11 of the host 10. After that, the host 10 supplies, via the CMD line, the card 20 with a second command for informing the card 20 of the newly set power supply voltage (operating voltage), and confirming the operation state of the card 20 at this operating voltage (step S2a). The second command contains, as an argument, information indicating the newly set operating voltage.

The card 20 receives the second command supplied from the host 10. If the card 20 is in a state in which it can be operated by the newly set power supply voltage, i.e. the operating voltage indicated by the received command, the card 20 supplies the host 10 with a response indicating its ready state, via the CMD line. On the other hand, if the card is not in that state, the card 20 supplies the host 10 with a response indicating its busy state, via the CMD line.

Until receiving the response indicating the ready state of the card 20 (step S3), the host 10 supplies the second command to the card 20 (step S2a).

Upon receiving the response indicating the ready state of the card 20, the host 10 determines that the card 20 has been sifted from the Idle State to the Ready State.

When determining that the card 20 has reached the Ready State, the host 10 acquires a card ID from the card 20 (step S4). The step S4 will be described in detail.

The host 10 supplies the card 20, via the CMD line, with a third command for acquiring the card ID from the card 20. The card 20 receives the third command output from the host 10. In accordance with the received third command, the card 20 acquires its own card ID from the card register file 21. After that, the card 20 supplies the host 10 with a response, having its own card ID set therein, in reply to the third command via the CMD line.

The host 10 receives the response output from the card 20 in reply to the third command. Subsequently, the host 10 extracts the card ID of the card 20 from the response. This card ID is transferred to an application program 143 (see FIG. 5) for using the card 20. As a result, the card 20 shifts from the Ready State to the Identification State. This Identification State is the final state of the Card Identification Mode. The above-described operations are the details of the step S4.

The host 10 acquires a card address from the card 20 in the Identification State (step S5). The step S5 will be described in detail.

The host 10 supplies the card 20, via the CMD line, with a fourth command for acquiring the card address from the card 20. The card 20 receives the fourth command output from the host 10. In accordance with the received fourth command, the card 20 acquires its own card address from the card register file 21. After that, the card 20 supplies the host 10 with a response, having its own card address set therein, in reply to the fourth command via the CMD line.

The host 10 receives the response output from the card 20 in reply to the fourth command. Subsequently, the host 10 extracts the card address of the card 20 from the response, thereby identifying the card 20. As a result, the host 10 shifts from the Card Identification Mode to the Data Transfer Mode, while the card 20 reaches the Standby State as the initial state of the Data Transfer Mode.

In the Standby State, the host 10 selects, using the card address acquired at the step S5, a card 20 to which the card address is assigned (step S6). The step S6 will be described in detail.

Using the acquired card address, the host 10 outputs a fifth command for selecting the card 20 to which the card address is assigned, to each CMD line on the card interface 11. Then, that one of the cards 20 connected to the card interface 11 of the host 10 reaches a selected state, to which the card address indicated by the fifth command from the host 10 is assigned, and which is now in a non-selected state. The card 20 having reached the selected state supplies the host 10, via the CMD line, with a response indicating that the card itself has been selected. As a result, the card 20 shifts from the Standby State to the Transfer State. Upon receiving the response from the card 20, the host 10 determines that the card 20 designated by the fifth command has been selected, and hence the card 20 has shifted to the Transfer State.

At the beginning of the Transfer State, the host 10 reads the card type and the operation mode of the card 20 selected at the step S6 (step S7). The step S7 will be described in detail.

The host 10 supplies the card 20, via the CMD line, with a sixth command for reading the card type and the operation mode of the card 20. The card 20 receives the sixth command. In accordance with the received sixth command, the card 20 acquires its own card type and operation mode from the card register file 21. After that, the card 20 supplies the host 10 with a response, having its own card type and operation mode set therein, in reply to the sixth command via the CMD line.

The host 10 receives the response output from the card 20 in reply to the sixth command. The host 10 extracts, from the response, the card type and operation mode of the card 20 selected at the step S6. The above-described operations are the details of the step S7.

In the embodiment, the operation mode of the card 20 differs between a case where the card 20 is a memory card and a case where it is an I/O card. In the case of the memory card, the operation mode is only one, i.e. a 4-bit transfer mode. On the other hand, the I/O card has five operation modes, i.e. (1) a 4-bit transfer mode, (2) a 1-bit I/O transfer mode, (3) a 2-bit I/O transfer mode, (4) a USB I/O transfer mode, and (5) a 1394 I/O transfer mode. Each transfer (operation) mode for the I/O card is collectively called an "I/O interface mode". Further, the transfer (operation) mode (4-bit transfer mode) for the memory card is called a "memory interface mode".

When the host 10 has acquired information indicating the card type and the operation mode of the selected card 20, it determines form the card type whether the card 20 is an I/O card or a memory card (step S8). In accordance with the determination result and the acquired operation mode, the host 10 executes a step S9a or S9b. At the step S9a or S9b, signal assignment to the card interface 11 is executed. This signal assignment corresponds to signal assignment to each signal pin of the card 20 (20a). Further, at the step S9a or S9b, a seventh command is supplied to the selected card 20 via a corresponding CMD line. The seventh command is used for informing the card 20 that its mode can be changed from the mode set at the start of the initialization process, in which only the CMD line is used, to an operation (transfer) mode peculiar to the card 20.

Upon receiving the seventh command output from the host 10, the card 20 sets its mode at the operation mode peculiar thereto. As a result, the card 20 can operate in a state in which signal assignment determined by the peculiar operation mode has been executed on each of the signal pins DAT[3]-DAT[0]. Thus, in the embodiment, the host 10 can use, when initializing a card 20, a mode peculiar to the card 20 as the operation mode including signal assignment to each of the signal pins (data terminals) DAT[3]-DAT[0] of the card 20, irrespective of, for example, the type of the card 20. In other words, in the embodiment, the host 10 can set the operation mode of an I/O card having the same pin arrangement as a memory card, using the same procedure as that for the memory card, irrespective of the type of the I/O card.

Referring now to FIG. 6, a description will be given of the relationship between signal assignment and each operation mode for the I/O card (20a), i.e. each I/O interface mode.

(1) 4-Bit Transfer Mode

In the 4-bit transfer mode, all pins DAT[3]-DAT[0], i.e. DAT[3:0], are assigned to be used as bidirectional data lines. This realizes an I/O interface for 4-bit transfer. Signal assignment in this mode is the same as signal assignment in the only one operation mode for a memory card, i.e. the memory interface mode (4-bit transfer mode).

The 4-bit transfer mode is effective in the case of an I/O card for a high-speed communication interface, which transfers a large amount of data at one time although it does not execute data transfer (i.e. transaction) many times. In this mode, however, an interrupt line cannot be assigned, contrast to the case of a 1-bit or 2-bit I/O transfer mode described later. Accordingly, the termination of transfer must be determined by, for example, polling.

(2) 1-Bit I/O Transfer Mode

In the 1-bit I/O transfer mode, only the pin DAT[0] is assigned to be used as a bidirectional data line. The pin DAT[1] is assigned to be used as a general purpose signal line from the I/O card (20a) to the host 10. The pin DAT[2] is assigned to be used as a WAIT/READY line for informing the host 10 of the state (WAIT/READY) of the I/O card (20a) in synchronism with a clock signal. The pin DAT[3] is assigned to be used as an interrupt line (INT/WAKE line) for outputting an asynchronous interrupt signal from the I/O card (20a) to the host 10.

The asynchronous interrupt signal sent via the INT/WAKE line is one of two types of signals. One is an interrupt signal (INT signal) output from the I/O card (20a) for informing the host 10 of, for example, the termination of data transfer. The other is an interrupt signal (WAKE signal) output from the I/O card (20a) for waking up the host 10 when the host is in a power down state or a suspended state, thereby restoring the host 10 to a normal operation state. This WAKE signal is output when the host 10 is in the power down state or the suspended state, therefore only the required minimum function of the I/O card (20a) is operable, and this function has detected a predetermined interface state. The predetermined interface state indicates, for example, that state of an I/O card having a telephone communication function, such as a modem interface, in which the card has received a call signal. In this case, the general purpose signal line (DAT[1]) can be used as an audio line.

The 1-bit transfer mode is effective in the case of an I/O card as an interface, which requires prompt start of data transfer (transaction) since it executes data transfer many times, although it does not transfer a large amount of data at one time.

(3) 2-Bit I/O Transfer Mode

In the 2-bit I/O transfer mode, the pins DAT[1] and DAT[0] are assigned to be used as bidirectional data lines. The pin DAT[2] is assigned to be used as a WAIT/READY line as in the 1-bit I/O transfer mode. The pin DAT[3] is assigned to be used as an INT/WAKE line as in the 1-bit I/O transfer mode. The 2-bit I/O transfer mode differs from the 1-bit I/O transfer mode in that the pin DAT[1] is assigned to be used as a data line and not as a general purpose signal line.

The 2-bit I/O transfer mode is effective in the case of an I/O card as a LAN interface, which does not require a general purpose signal line but requires higher-speed transfer (higher-speed communication) than the I/O card that uses the 1-bit I/O transfer mode.

(4) USB I/O Transfer Mode

The USB I/O transfer mode is effective where the I/O card (20a) is a USB interface. In this mode, the pins DAT[1] and DAT[0] are assigned to be used as USB data lines.

(5) 1394 I/O Transfer Mode

The 1394 I/O transfer mode is effective where the I/O card (20a) is an IEEE (Institute of Electrical and Electronics Engineers, Inc.) 1394 interface. In this mode, the four signal lines DAT[3]-DAT[0], i.e. DAT[3:0], are assigned to be used as IEEE 1394 data lines.

Figure 7:
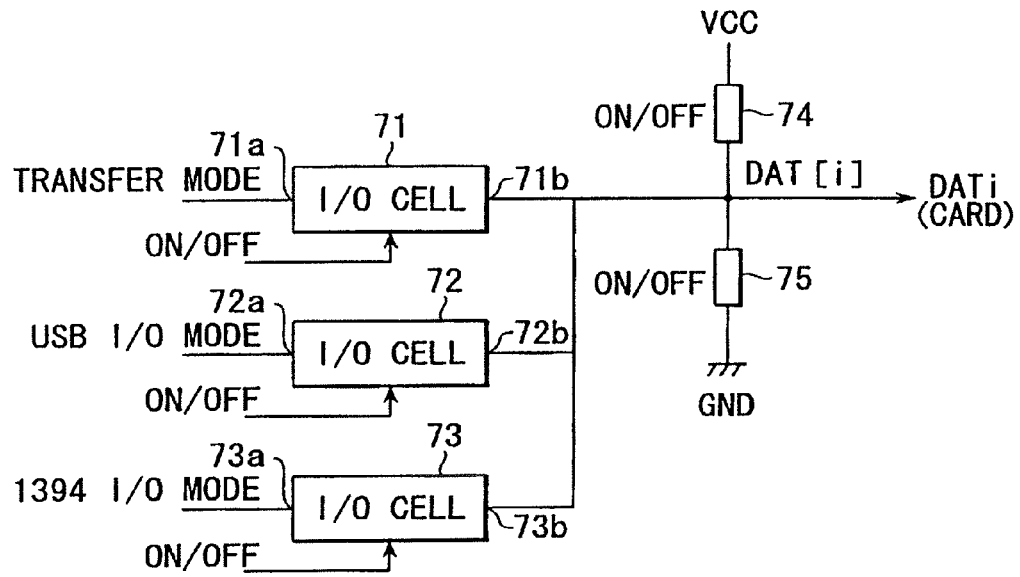
FIG. 7 is a view illustrating an essential part of a card interface 11 for realizing each operation mode.

In the embodiment, three types of 1-bit I/O cells 71, 72 and 73 are provided for each signal line DAT[i] (i=3–0) in the card interface 11 of the host 10, as is shown in FIG. 7. The cells 71, 72 and 73 have host-side 1-bit input/output terminals 71a, 72a and 73a and card-side 1-bit input/output terminals 71b, 72b and 73b, respectively. The 1-bit input/output terminals 71b, 72b and 73b are connected to each signal line DAT[1] of the card interface 11. The I/O cell 71 is used for realizing an interface function peculiar to the operation mode of the card 20, if the operation mode is a transfer mode, i.e. if it is the 4-bit transfer mode, the 1-bit transfer mode or the 2-bit transfer mode. The I/O cell 72 or 73 is each used for realizing an interface function peculiar to the operation mode of the card 20, if the operation mode is the USB I/O transfer mode or the 1394 I/O transfer mode. The interface function of each cell 71, 72 or 73 can be turned on or off from the outside. The signal line DAT[1] is connected to an end of an active pull-up resister 74 and an end of an active pull-down resister 75. The resisters 74 and 75 can be turned on and off from the outside.

At the aforementioned step S9a or S9b, the initialization basic driver 141 in the host 10 turns on only that one of the cells 71, 72 and 73, which corresponds to the operation mode of a card 20 selected at the step S6, in order to enable the realization of an interface function peculiar to the operation mode. Further, the initialization basic driver 141 turns on and off the resisters 74 and 75 in accordance with the operation mode.

As described above, after the host 10 acquires information indicating the card type and the operation mode of the card 20 selected at the step S6 (step S7), it determines from the card type whether the card 20 is a memory card or an I/O card (step S8).

If the card 20 is a memory card, the host 10 executes signal assignment on the card interface 11 on the basis of the operation mode peculiar to the memory card and obtained at the step S7 (step S9b). Further, at the step S9b, the host 10 supplies the card 20, via the CMD line, with the seventh command for informing the card 20 that the mode can be changed to the operation mode peculiar to the card 20. After executing the step S9b, the host 10 determines that the initialization process on the card 20 (memory card) has finished. In this state, the host 10 can be operated using the card 20 (memory card) (step S16).

On the other hand, if the card 20 is an I/O card, the host 10 executes signal assignment on the card interface 11 on the basis of the operation mode obtained at the step S7, as in the case of the memory card (step S9*a*). Further, at the step S9*a*, the host 10 supplies the card 20 with the seventh command.

Moreover, when the card 20 is an I/O card (20*a*), the host 10 determines that the initialization process on the I/O card is not completed simply by executing the step S9*a*. This is because when the card 20 is an I/O card, configuration settings for realizing a plug-and-play function are necessary.

To this end, the host 10 reads the contents (PnP information) of the system I/0 register 22 from the previously selected card 20, i.e. the I/O card 20*a* (step S10). The step S10 will be described in detail.

The host 10 supplies the card 20*a*, via the CMD line, with an eighth command for reading the PnP information from the system I/O register 22 in the I/O card 20*a*. The card 20*a* receives the eighth command output from the host 10. In accordance with the received eighth command, the card 20*a* reads the PnP information from the system I/O register 22. After that, the card 20*a* supplies the host 10 with a response, having the read PnP information set therein, in reply to the eighth command via the CMD line.

The host 10 receives the response output from the card 20*a* in reply of the eighth command, and reads, from the response, the PnP information peculiar to the I/O card 20*a*. The above operations are the details of the step S10.

After reading the PnP information peculiar to the I/O card 20*a*, the host 10 refers to it (step 511). From the PnP information, the host 10 determines whether or not a device driver 142*a* (see FIG. 5) is attached to the I/O card 20*a* (step S12). The device driver 142*a* is peculiar to the I/O card 20*a* connected to the card interface 11 of the host 10. Attaching the device driver 142*a* to the I/O card 20*a* means that the driver 142*a* is stored in the ROM 202 incorporated in the I/O card 20*a*.

If the device driver 142*a* is attached, the initialization basic driver 141 in the host 10 determines whether or not the device driver 142*a* attached to the I/O card 20*a* has already been downloaded as a device driver 142*b* (see FIG. 5) into the host 10 (step S13*a*). If the device driver 142*a* is already downloaded as the device driver 142*b*, the initialization basic driver 141 determines whether or not the version of the driver 142*b* is older than the version indicated by the PnP information (step S13*b*).

Figure 5:
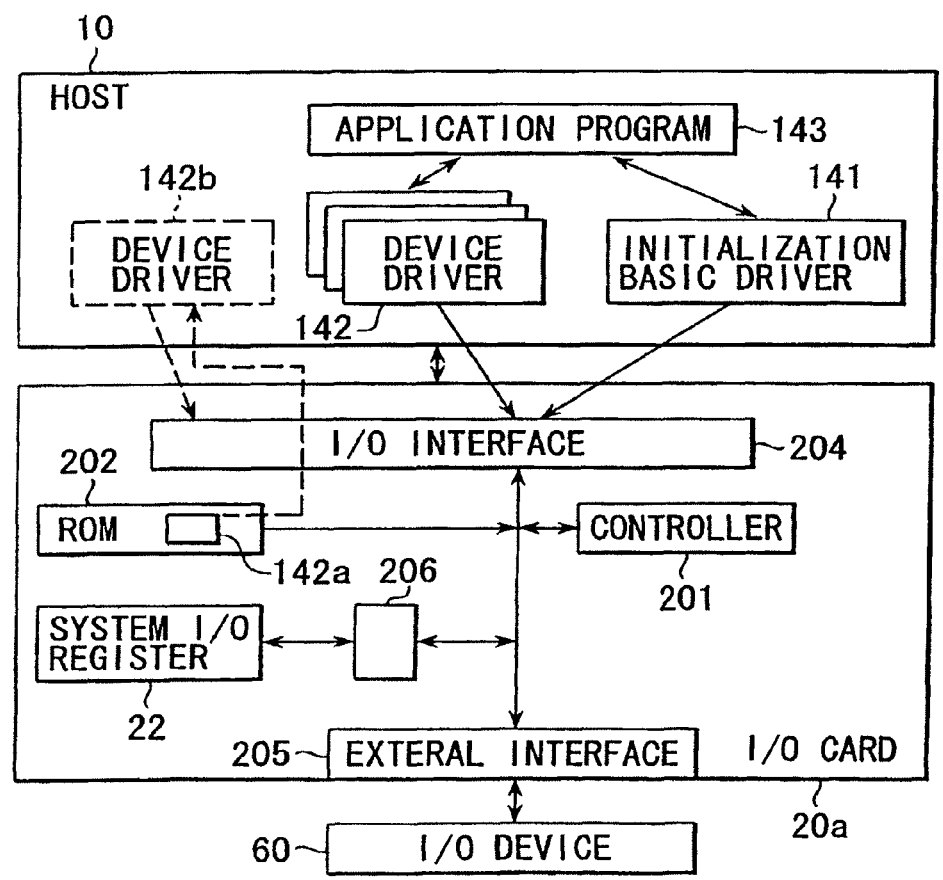
FIG. 5 is a block diagram useful in explaining download of a device driver from the I/O card 20a to the host 10.

If the device driver 142*b* is not downloaded to the host 10, the host 10 executes a step S14. The step S14 is executed even when the device driver 142*b* has been downloaded, if the version of the device driver 142*b* is older than that indicated by the PnP information. At the step S14, the device driver 142*a* stored in the ROM 202 of the I/O card 20*a* is downloaded as the device driver 142*b* into the host 10 via a data line determined by the operation (transfer) mode of the card 20*a*, as is shown in FIG. 5. As a result, the next step et seq. are executed under the control of the device driver 142*b*, in place of the initialization basic driver 141. At the next step, i.e. at a step S15, a system configuration for the I/O card 20*a* is automatically set up in the host 10 by the downloaded updated device driver 142*b* on the basis of the PnP information. Thus, in the embodiment, the plug-and-play function can be realized for each card 20 (20*a*) connected to the host 10, even when different device drivers corresponding to the respective types of cards 20 are not pre-installed in the host 10.

On the other hand, if no device driver 142*a* is attached to the I/O card 20*a* (step S12), the steps S13*a*, S13*b* and S14 are skipped over, and the step S15 is executed. At the step S15, the system configuration for the I/O card 20*a* is automatically set up on the basis of the PnP information by that one of the device drivers 142 installed in the host 10, which is peculiar to the type of the I/O card 20*a*. Further, even when the device driver 142*a* is attached to the I/O card 20*a*, if a device driver 142*b*, whose version is the same as or more recent than the version indicated by the PnP information, is already downloaded to the host 10 (steps S12, S13*a* and S13*b*), the step S14 is skipped over and the step S15 is executed. At the step S15, automatic configuration settings for the I/O card 20*a* are executed on the basis of the PnP information by the device driver 142*b* that is already downloaded to the host 10.

After the automatic configuration settings for the I/O card 20*a* finish, the host 10 reaches a state in which it is operable using the I/O card 20*a* (20) (step S16).

When the host 10 is in the state in which it is operable using the card 20 (20*a*), an application program 143 incorporated in the host 10 can use the card 20 (20*a*) and execute thereon a process peculiar thereto.

The system shown in FIG. 2 requires, between the system memory 13 of the host 10 and the card 20*a*, a data transfer unit for executing data transfer. In the prior art, this type of data transfer unit is provided in the card 20*a*. In this case, the data transfer unit must access the system memory 13 via the card interface 11 under the limitation of a data width (a data transfer width) usable for data transfer and employed in the card interface 11. Therefore, it is difficult to execute high-speed data transfer between the data transfer unit and the system memory 13.

Figure 8:
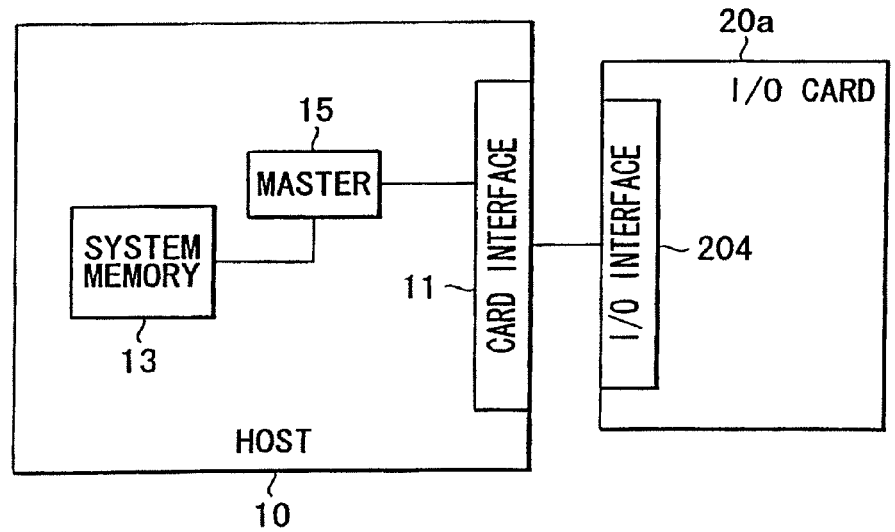
FIG. 8 is a block diagram showing an example of a structure in which a master 15 is incorporated in the host 10.

On the other hand, in the embodiment, the data transfer unit is provided in the host 10. The data transfer unit provided in the host 10 is called a "master". FIG. 8 illustrates an example of a structure in which a master is provided in the host 10. In FIG. 8, a master 15 is interposed between the system memory 13 and the card interface 11. The I/O card 20*a* is inserted in a card slot of the card interface 11. The master 15 executes data transfer between the system memory 13 and the I/O card 20*a*. At this time, the master 15 can access the system memory 13 without being limited by the number of signal lines usable for data transfer and provided in the card interface 11. The data width of a bus that connects the system memory 13 to the master 15 is sufficiently larger than the data transfer width of the card interface 11. Accordingly, the master 15 provided in the host 10 can realize high-speed data transfer between itself and the system memory 13, without being limited by a data transfer width, even if small, between the host 10 and the card 20*a*.

There is a case where the user of the host 10 wants to switch the card 20 (20*a*) selected at the step S6 to another card 20 (20*a*). In this case, a request for switching the card is supplied from the application program 143 shown in FIG. 5 to the initialization basic driver 141. Upon receiving the request, the initialization basic driver 141 causes the currently selected card 20 (20*a*) to reach a non-selected state (step S17). The step S17 will now be described in detail.

The initialization basic driver 141 supplies the card 20 (20*a*), via the CMD line, with a ninth command for causing the currently selected card 20 (20*a*) to reach a non-selected state. Upon receiving the ninth command supplied from the host 10, the card 20 (20*a*) shifts to the non-selected state in accordance with the command.

In the embodiment, the fifth command for selecting a non-selected card 20 (20*a*) is the same command (a card selecting command) as the ninth command for causing a selected card 20 (20*a*) to reach a non-selected state. When the card selecting command is supplied to a non-selected card 20 (20*a*), it functions as a command for selecting the card 20 (20*a*). On the other hand, when the command is supplied to a selected card 20 (20*a*), it functions as a command for causing the selected card 20 (20*a*) to reach the non-selected state.

After the initialization basic driver 141 causes the card 20 (20*a*) selected at the step S6 to reach a non-selected state at the step S17, the program returns to the step S6. At this time, the initialization basic driver 141 can select another card 20 (20*a*) requested by the application program 143.

If the user of the host 10 no more needs to use the card 20 (20*a*) and hence wants to shift the card 20 (20*a*) to a power-off state, an inactivation command is supplied to the card 20 (20*a*) via the CMD line by the initialization basic driver 141 of the host 10 (step S18). Upon receiving the inactivation command output from the host 10, the card 20 (20*a*) shifts from the Transfer State to the Inactive State. In this state, the supply of power to the card 20 (20*a*) is interrupted.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A system having a non-volatile programmable memory and a controller, said system comprising:
   data pins that are configured to be accessed in one of a first mode and a second mode such that, in the first mode, the system receives information using one of the data pins and, in the second mode, the system receives information using four of the data pins;
   a command pin that is configured to receive a first command, a second command, and a third command, said first command requesting a current operation mode of said data pins, said second command requesting operation voltage information of said system, and said third command setting said system into one of said first and second modes; and
   a power signal pin configured to receive power for said system.

2. The system according to claim 1, wherein the controller is configured to receive power voltage information concerning a power voltage.

3. The system according to claim 2, wherein the controller is configured to transmit a response if the system can operate with the power voltage.

4. The system according to claim 2, wherein the controller is configured to receive an initial voltage via the power signal pin before receiving the power voltage information.

5. The system according to claim 4, wherein the initial voltage differs from the power voltage.

6. The system according to claim 1, wherein the controller is configured to receive a fourth command for reading an address, assigned to the system via the command pin, and
   wherein the controller is configured to transmit the address via the command pin in response to the fourth command.

7. The system according to claim 6, wherein the controller is configured to receive a fifth command for selecting the system, the fifth command including an address indicating a system to be selected; and
   wherein the controller is configured to shift the system to a selected state if the address included in the fifth command is identical to the address assigned to the system.

8. The system according to claim 1, wherein the controller is configured to receive a fourth command for reading identification data, unique to the system via the command pin; and
   wherein the controller is configured to transmit the identification data via the command pin in response to the fourth command.

9. The system according to claim 8, wherein the controller is configured to shift the system from a ready state to an identification state after transmitting the identification.

* * * * *